Sept. 3, 1957 J. CAYZAC 2,805,334

FREQUENCY DISCRIMINATOR CIRCUIT ARRANGEMENT
FOR ULTRA HIGH-FREQUENCY OSCILLATIONS

Filed Nov. 27, 1953 3 Sheets-Sheet 1

INVENTOR
JACQUES CAYZAC

BY [signature]

AGENT

INVENTOR
JACQUES CAYZAC

BY [signature]

AGENT

INVENTOR
JACQUES CAYZAC
BY [signature]
AGENT

United States Patent Office 2,805,334

Patented Sept. 3, 1957

2,805,334

FREQUENCY DISCRIMINATOR CIRCUIT ARRANGEMENT FOR ULTRA HIGH-FREQUENCY OSCILLATIONS

Jacques Cayzac, St. Hilaire, France, assignor, by mesne assignments, to North American Philips Company, Inc., New York, N. Y., a corporation of Delaware Application November 27, 1953, Serial No. 394,810

5 Claims. (Cl. 250—27)

The invention relates to a frequency discriminator circuit for producing a direct voltage varying with the deviation of the frequency of ultra high-frequency oscillations from a nominal frequency.

The invention may be applied with particular advantage to the production of a control-voltage suitable for automatic frequency correction (A. F. C.) of an ultra high-frequency oscillator.

Known discriminator circuits of the said type comprise two resonant circuits detuned symmetrically relatively to a central frequency, to which circuits two detectors in relatively opposite connection are connected in order to obtain the desired direct voltage.

These known discriminator circuits often do not yield satisfactory results with very high frequencies, for example of the order of 6000 mc./s.

The invention has for its object to provide a discriminator circuit of the type referred to above, operating in a reliable manner even at such high frequencies. According to the invention it is for this purpose provided with two cavity resonators fed by the ultra high-frequency oscillations and tuned to frequencies lying one on each side of the nominal frequency and each comprising a variable damping member, these damping members being connected in push-pull to a switching-voltage generator and producing a damping of the cavity resonators varying with the instantaneous value of the switching-voltage, the cavity resonators being provided with output conductors connected through a common coupling conductor to an amplitude detector, of which the output voltage, having switching-voltage frequency, in common with a voltage derived directly from the switching-voltage generator, controls a phase detector, the direct output voltage of which varies with the deviation of the frequency of the ultra-frequency oscillations from the nominal frequency.

In conventional discriminator circuits the direct voltage is customarily obtained by means of two detectors in differential arrangement. In this case use must be made of identical detectors, which can be carried out only with difficulty and with very high frequencies, which require the use of crystal diodes, can substantially not be carried out owing to unequal temperature coefficients and unequal aging of the crystals.

These requirements of equality do not apply to the discriminator circuit according to the invention, since in this case the voltages derived from the two cavity resonators are supplied to a common detector.

In the discriminator according to the invention the damping members each comprise preferably a one loop conductor coupled with the cavity resonator concerned and a premagnetised ferrite rod passing through the loop conductor, this rod being provided with an energising winding connected to the switching voltage generator.

In order that the invention may be readily carried into effect, it will now be described with reference to the accompanying drawing.

Fig. 1 shows a block diagram of a transmitting device comprising an A. F. C. circuit with a frequency discriminator circuit according to the invention.

Figure 1:
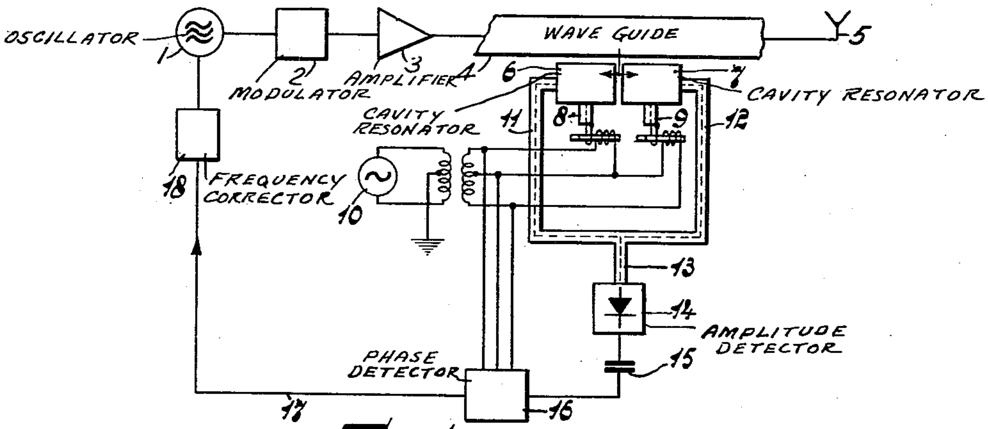

Fig. 1 shows a block diagram of a transmitting device comprising an ultra high-frequency oscillator 1; the ultra high-frequency oscillations derived therefrom are supplied through a modulator 2, an amplifying stage 3 and a wave guide 4 to a transmitting aerial 5. To the wave guide 4 is connected a frequency discriminator circuit for producing a direct control-voltage, supplied through a conductor 17 for automatic frequency correction to a correction member 18, coupled with the oscillator 1 or forming part thereof.

According to the invention the discriminator circuit comprises two cavity resonators 6 and 7, coupled with the wave guide 4 and tuned to frequencies lying one on each side of the nominal frequency and each comprising a variable damping member 8 and 9 respectively. The damping members are connected in push-pull to a switching voltage generator 10 and produce a damping of the cavity resonators 6 and 7, varying with the instantaneous value of the switching voltage.

These cavity resonators are furthermore provided with output conductors 11 and 12 respectively, connected through a common coupling conductor 13, to an amplitude detector 14. The detector 14 supplies via coupling capacitor 15 an output voltage having the switching-voltage frequency and controlling a phase detector 16 in conjunction with a voltage derived from the switching voltage generator 10, in order to obtain a direct voltage varying with the deviation of the frequency of the ultra high-frequency oscillations from the nominal frequency.

Figure 4:
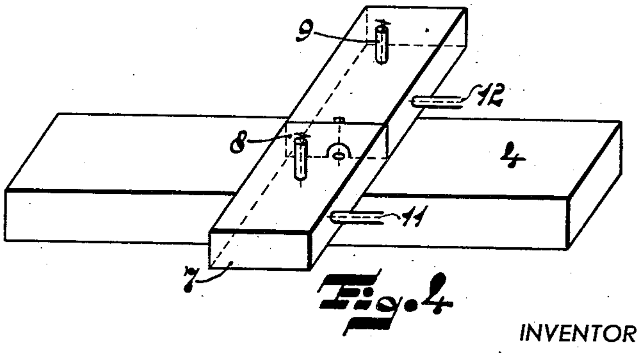
Figs. 4 and 4a are perspective views of structural details.
Figure 4A:
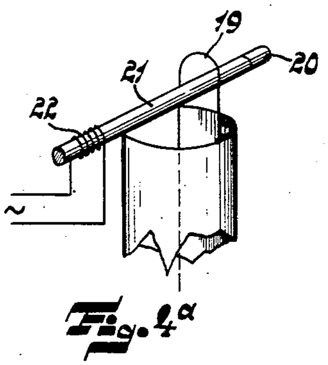

The damping members used herein and described more fully with reference to Fig. 4a comprise premagnetized ferrite rods, each provided with an energizing winding.

The preferably rectangular voltage of low frequency derived from the switching voltage generator 10 and supplied in push-pull to the energizing windings of the ferrite rods coupled with the cavity resonators 6 and 7, produces a periodical switching, so that the cavity resonators become alternately operative. The switching voltage produces a damping of the cavity resonators 6 and 7, varying with the instantaneous value of the said voltage, this damping producing a strong variation of the quality factor Q of the cavity resonators.

Figure 2:
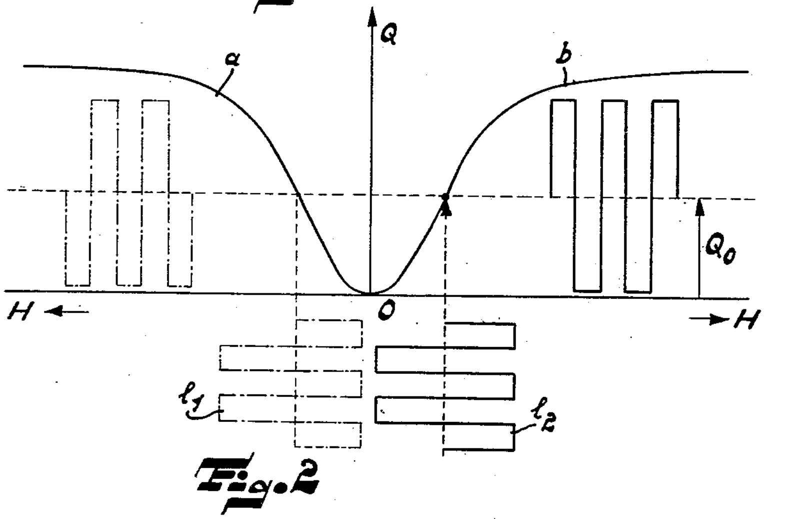
Figs. 2, 3 and 5 show characteristic curves for further explanation of the invention.

This switching operation is illustrated by the characteristic curves *a* and *b* of Fig. 2, in which the variation of the factors Q of the cavity resonators 6 or 7 is plotted as a function of the magnetic energizing field H of the ferrite rods to the left and to the right respectively of the zero point of the co-ordinates. The ferrite rods are premagnetized for example by means of a permanent magnet, so that in the absence of a governing voltage the quality factor $Q_0$ prevails for the two circuits.

Fig. 2 shows that at a suitable amplitude of the push-pull operating governing voltages $e_1$ and $e_2$ the factors Q of the cavity resonators vary in such a manner with the instantaneous value of the governing voltage that the factor Q of one cavity resonator is very small, so that this resonator is substantially out of operation at the instant when the factor Q of the other resonator is at a maximum. Thus the output conductors 11 and 12 have produced across them a voltage which initiates alternately from the one and from the other cavity resonator and which is supplied via the common coupling conductor 13 to the amplitude detector 14, detecting the envelope having the switching voltage frequency. After its direct-current component has been suppressed by means of the capacitor 15, this voltage is supplied to the phase detector 16 in order to obtain the desired direct control-voltage.

Figure 3:
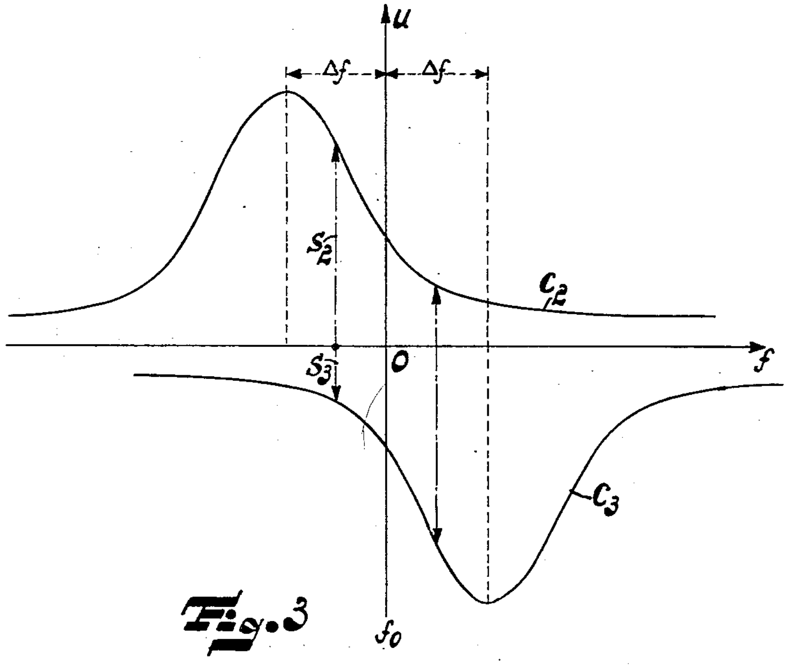

Fig. 3 shows resonance curves of the cavity resonators 6 and 7. The nominal frequency $f_0$ is plotted as the zero point of the co-ordinates; the cavity resonators 6 and 7 are detuned symmetrically relatively to the frequency $f_0$. At an oscillator frequency $f$ less than the nominal value $f_0$ the voltage $S_2$ of one cavity resonator, for example 6, exceeds the voltage $S_3$ of the other cavity resonator 7. The conditions are reversed, if the frequency of the oscillator exceeds the frequency $f_0$; the voltages $S_2$ and $S_3$ have equal amplitudes, if the generator supplies the frequency $f_0$.

Fig. 4 is a perspective view of one embodiment of the coupling of the cavity resonators 6 and 7 with the wave guide 4. Parts corresponding to those of Fig. 1 are designated by the same reference numerals. The cavity resonators are arranged symmetrically relatively to a common partition. In the plane of this partition provision is made of a coupling aperture common to the two resonators, through which the oscillations occurring in the wave guide 4 are evenly supplied to the two resonators.

Fig. 4*a* is a detail view of one of the damping members 8 or 9, shown in Figs. 1 and 4. The damping member comprises a loop conductor 19, coupled with the resonator concerned and a ferrite rod 21, passing through the loop conductor and premagnetised by a permanent magnet 20, this rod being provided with an energizing winding 22.

Figure 5:
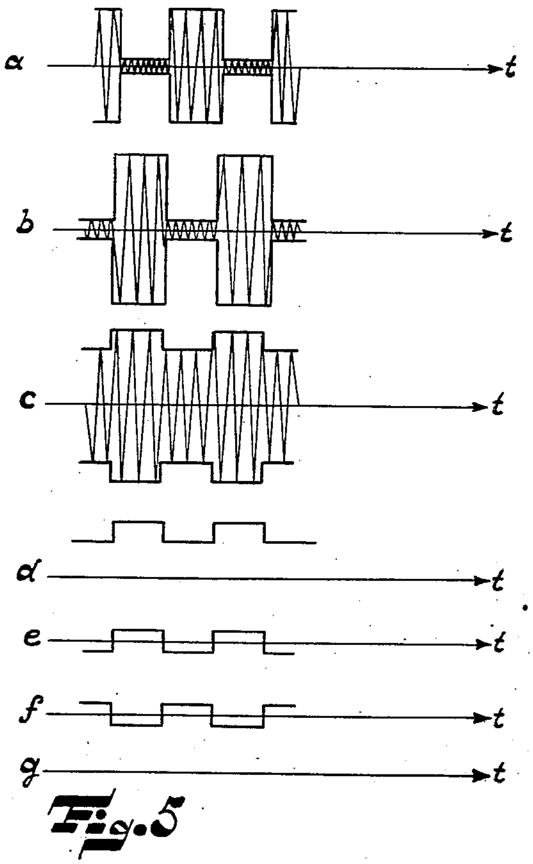

Fig. 5 shows voltages occurring at various points of the arrangement shown in Fig. 1. Figs. 5*a* and 5*b* show the high-frequency voltages derived from the cavity resonators 6 and 7 through conductors 11 and 12 respectively and their envelopes in the case of a detuning of the oscillator in the direction of the tuning frequency of the resonator 7. Fig. 5*c* shows the combined high-frequency voltages occurring across the coupling conductor previous to detection, whereas Fig. 5*d* shows the voltage having the switching voltage frequency obtained after detection. Fig. 5*e* shows the same voltage after suppression of the direct-current component.

Figs. 5*f* and 5*g* show the voltages corresponding to those of Fig. 5*e* in the case of a detuning of the oscillator in the sense of the tuning frequency of the cavity resonator 6, and at an oscillator frequency $f_0$.

The voltages shown in Figs. 5*e* and 5*f* have an amplitude, which is proportional to the frequency deviation from the nominal frequency $f_0$ and exhibit a phase which varies with the polarity of the frequency deviation.

Figure 6:
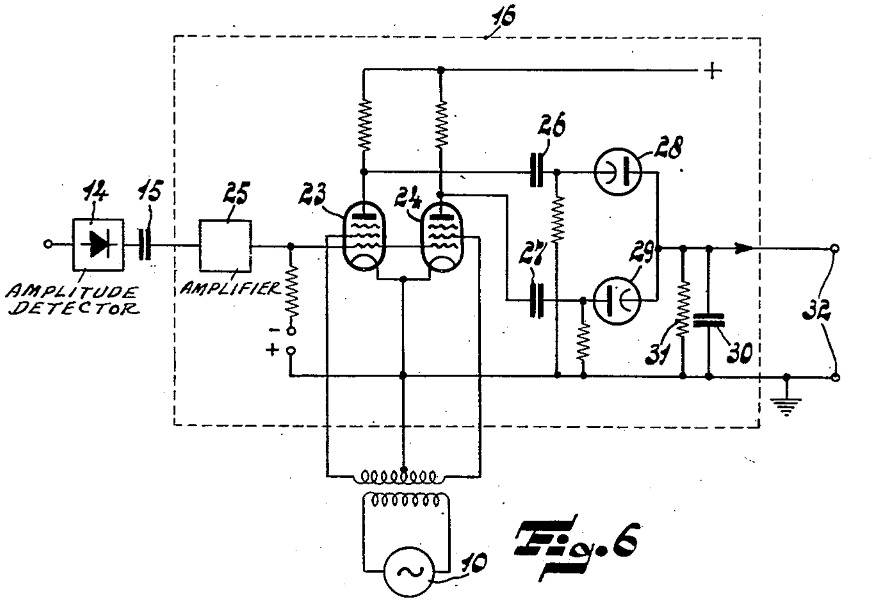
Fig. 6 shows one embodiment of the phase detector shown diagrammatically in Fig. 1.

Fig. 6 shows one embodiment of the phase detector 16, indicated in Fig. 1. It comprises two mixer-connected pentodes 23 and 24, to the screen-grids of which a voltage derived from the switching-voltage generator 10 is supplied in push-pull, whilst the voltage derived via the capacitor 15 from the detector 14 (5*e* or 5*f* shown in Figs. 5*e–g*) is supplied, subsequent to amplification in an amplifying stage 25, in parallel-combination to the control-grids of these tubes.

The tubes 23 and 24 are normally cut off and are released alternately by the positive halfwaves of the governing voltage supplied to the screen grids. If in one of the tubes such a positive halfwave of the switching-voltage coincides with a positive halfwave of the detected voltage, the tube concerned takes anode current. The voltages at the anodes of the mixing tubes are supplied through a coupling capacitor 26 or 27 respectively to two detector diodes 28 and 29, having opposite senses of passage. Across a detector output resistor 31, shunted by a capacitor 30, occurs a direct control-voltage, of which the value and polarity vary with the value and the polarity of the deviation of the oscillator frequency relative to the nominal frequency. This direct control-voltage is supplied via the output terminals 32 to the frequency corrector (18 of Fig. 1).

The frequency corrector may be constituted by an electronic or mechanical correction element or else one of the electrodes of the oscillator tube, for example the reflector electrode of a reflex-klystron may be utilised for frequency correction.

In the embodiment described above a rectangular switching voltage is supplied to the energizing windings of the damping members. As an alternative a governing voltage of other waveform may be used; however, a rectangular switching voltage is found to be preferable for reasons of stability.

The completely electrical circuit system of the cavity resonators described above may be replaced by an electromechanical governing system; the damping may, for example, be varied by means of a rotating disc provided with a vane, which rotates periodically through a slot provided in the cavity resonator.

The coupling between the wave guide 4 and the cavity resonators 6 and 7, shown in Fig. 4, may, of course, be replaced by a different, known coupling, which fulfils the requirement that the two cavity resonators are equally excited, irrespective of the waveform of the guide 4. It should finally be noted that the phase detector described above may, of course, be replaced by a different, known detector.

What is claimed is:

1. A frequency discriminator circuit arrangement for producing a direct voltage varying with the deviation of the frequency of ultra high frequency oscillations from a nominal frequency, comprising an oscillator for producing said ultra high frequency oscillations, a pair of cavity resonators respectively tuned to frequencies lying on each side of said nominal frequency, means connected to feed said ultra high frequency oscillations to both of said resonators, a pair of variable damping members electrically coupled respectively to said resonators, a switching voltage generator for producing an alternating switching voltage, means connected to feed said switching voltage in push-pull to said damping members to vary the damping alternately in said resonators, said resonators being provided respectively with signal output conductors, a common coupling conductor connected to said signal output conductors, a single amplitude detector connected to said common coupling conductor to receive signals from both of said resonators and produce an amplitude-detected signal containing the switching voltage frequency as an alternating component thereof, a phase detector connected to receive said amplitude-detected signal, and means connecting said switching voltage to said phase detector to vary the detection polarization characteristic thereof in synchronism with said alternating component of the amplitude-detected signal, whereby said phase detector provides a direct output voltage which varies with the deviation of the frequency of said ultra high frequency oscillations from said nominal frequency.

2. A frequency discriminator circuit as claimed in claim 1, in which said cavity resonators are positioned side-by-side and have a common side wall and include a common partition therebetween, and in which said means for feeding said ultra high frequency oscillations to said resonators comprises a coupling aperture in said side wall centered on the plane of said partition.

3. A frequency discriminator circuit as claimed in claim 1, in which said variable damping members each comprises a loop conductor coupled respectively with one of said resonators, a premagnetized ferrite rod positioned to pass through said loop conductor, and an energizing winding coupled to said rod and connected to said switching voltage generator.

4. A frequency discriminator circuit as claimed in claim 1, in which said amplitude detector comprises a single crystal diode.

5. A frequency discriminator circuit as claimed in claim 1, in which said phase detector comprises two multi-grid electron tubes having control grids connected in parallel to said amplitude detector to receive said amplitude-detected signal, means connecting said switching voltage in push-pull to remaining grids respectively in said tubes, an output filter, and a pair of diodes, said tubes each containing an anode, and said diodes being connected in opposite polarity between said output filter and the respective anodes of said electron tubes.

References Cited in the file of this patent

UNITED STATES PATENTS

| | | |
|---|---|---|
| 2,404,568 | Dow | July 23, 1946 |
| 2,420,264 | Rost et al. | May 6, 1947 |
| 2,586,497 | Ginzton et al. | Feb. 19, 1952 |
| 2,593,463 | Kinzer | Apr. 22, 1952 |
| 2,594,263 | Munster | Apr. 22, 1952 |